United States Patent
Antonie van der Wagt

(10) Patent No.: US 10,996,272 B2
(45) Date of Patent: May 4, 2021

(54) ONE-SHOT CIRCUIT

(71) Applicant: Teradyne, Inc., North Reading, MA (US)

(72) Inventor: Jan Paul Antonie van der Wagt, Carlsbad, CA (US)

(73) Assignee: TERADYNE, INC., North Reading, MA (US)

( * ) Notice: Subject to any disclaimer, the term of this patent is extended or adjusted under 35 U.S.C. 154(b) by 219 days.

(21) Appl. No.: 14/470,574

(22) Filed: Aug. 27, 2014

(65) Prior Publication Data

US 2016/0065183 A1 Mar. 3, 2016

(51) Int. Cl.
| | |
|---|---|
| *H03K 3/037* | (2006.01) |
| *G01R 31/3183* | (2006.01) |
| *H03K 5/04* | (2006.01) |
| *H03K 3/033* | (2006.01) |
| H03K 5/00 | (2006.01) |
| G01R 31/319 | (2006.01) |

(52) U.S. Cl.
CPC ..... *G01R 31/318392* (2013.01); *H03K 3/033* (2013.01); *H03K 5/04* (2013.01); *G01R 31/31917* (2013.01); *H03K 2005/00013* (2013.01)

(58) Field of Classification Search
CPC ..... H03K 5/04–065; H03K 5/15–1515; H03K 3/033; H03K 3/037; G01R 31/318392; G01R 31/3187–31928
See application file for complete search history.

(56) References Cited

U.S. PATENT DOCUMENTS

| | | | |
|---|---|---|---|
| 5,298,799 A | 3/1994 | Cochran et al. | |
| 5,359,232 A * | 10/1994 | Eitrheim | G06F 1/10 327/116 |
| 5,883,534 A | 3/1999 | Kondoh et al. | |
| 6,069,506 A * | 5/2000 | Miller, Jr. | H03L 7/0814 327/156 |
| 6,218,874 B1 * | 4/2001 | Lerner | H03L 7/00 327/144 |
| 6,222,422 B1 * | 4/2001 | Opris | H03K 5/151 327/159 |
| 6,291,891 B1 | 9/2001 | Higashi et al. | |

(Continued)

FOREIGN PATENT DOCUMENTS

| | | |
|---|---|---|
| CN | 1457433 A | 11/2003 |
| CN | 1457433 A | 11/2003 |

(Continued)

OTHER PUBLICATIONS

International Search Report and Written Opinion dated Nov. 27, 2015 in international application No. PCT/US2015/046082, 11 pgs.

(Continued)

*Primary Examiner* — Huy Q Phan
*Assistant Examiner* — David B Frederiksen
(74) *Attorney, Agent, or Firm* — Burns & Levinson LLP

(57) ABSTRACT

An example one-shot circuit includes: circuitry including a set-reset (SR) latch to produce an output pulse of controlled duration in response to an input signal rising edge, where the SR latch includes a first circuit input and a second circuit input; a circuit path to provide a signal to the first circuit input; and a delay element connected to the circuit path and to the second circuit input.

16 Claims, 6 Drawing Sheets

(56) References Cited

U.S. PATENT DOCUMENTS

| | | | |
|---|---|---|---|
| 6,291,981 B1 | 9/2001 | Sartschev | |
| 6,317,842 B1* | 11/2001 | Nguyen | G06F 5/06 |
| | | | 713/400 |
| 6,326,828 B1* | 12/2001 | Gaiser | H03K 3/012 |
| | | | 327/199 |
| 6,642,760 B1* | 11/2003 | Alon | H03K 3/037 |
| | | | 327/158 |
| 6,687,868 B1 | 2/2004 | Furukawa et al. | |
| 6,771,061 B2* | 8/2004 | Sartschev | G01R 31/2891 |
| | | | 324/76.47 |
| 6,774,694 B1* | 8/2004 | Stern | H03K 5/1508 |
| | | | 327/276 |
| 7,557,643 B2 | 7/2009 | Jin et al. | |
| 8,773,166 B1* | 7/2014 | Gaide | H03K 19/01707 |
| | | | 326/38 |
| 9,147,620 B2 | 9/2015 | van der Wagt et al. | |
| 2001/0014131 A1* | 8/2001 | Mashimo | H03D 3/04 |
| | | | 375/289 |
| 2002/0129311 A1* | 9/2002 | Ewen | G01R 31/3187 |
| | | | 714/733 |
| 2003/0033556 A1* | 2/2003 | West | G01R 31/319 |
| | | | 714/25 |
| 2003/0218490 A1* | 11/2003 | Jang | G06F 1/04 |
| | | | 327/291 |
| 2004/0123175 A1* | 6/2004 | Roth | G06F 5/08 |
| | | | 713/401 |
| 2005/0024120 A1* | 2/2005 | Chang | G06G 7/186 |
| | | | 327/336 |
| 2007/0080735 A1 | 4/2007 | Uladzimir | |
| 2008/0025457 A1* | 1/2008 | Pyeon | H03K 21/38 |
| | | | 377/118 |
| 2008/0224756 A1* | 9/2008 | Prodic | H03K 7/08 |
| | | | 327/392 |
| 2009/0009182 A1* | 1/2009 | Bainbridge | G01R 31/3187 |
| | | | 324/537 |
| 2009/0218999 A1* | 9/2009 | Kikuchi | H02M 3/156 |
| | | | 323/282 |
| 2009/0249141 A1* | 10/2009 | Yasuda | G01R 31/31727 |
| | | | 714/724 |
| 2011/0018599 A1* | 1/2011 | Abbasfar | H03K 5/15 |
| | | | 327/158 |
| 2011/0051502 A1* | 3/2011 | Rao | G11C 29/12015 |
| | | | 365/158 |
| 2011/0316557 A1* | 12/2011 | Watanabe | G01R 31/31922 |
| | | | 324/601 |
| 2012/0049889 A1* | 3/2012 | Hatano | H01L 27/1156 |
| | | | 326/102 |
| 2012/0313647 A1* | 12/2012 | Carpenter | G11C 7/10 |
| | | | 324/612 |
| 2012/0326738 A1 | 12/2012 | Kim et al. | |
| 2012/0326760 A1* | 12/2012 | Kesselring | H03K 3/017 |
| | | | 327/175 |
| 2013/0260485 A1 | 10/2013 | van der Wagt et al. | |
| 2014/0118043 A1* | 5/2014 | Thiagarajan | H03K 5/156 |
| | | | 327/175 |

FOREIGN PATENT DOCUMENTS

| | | |
|---|---|---|
| CN | 102832914 A | 12/2012 |
| CN | 203326968 U | 12/2013 |
| JP | H09-321614 A | 12/1997 |
| JP | 2002-057559 A | 2/2002 |
| WO | WO-2013/148085 A1 | 10/2013 |

OTHER PUBLICATIONS

International Preliminary Report on Patentability for PCT/US2015/046082, 7 pages (dated Feb. 28, 2017).

Japanese Notice of Reasons for Rejection for JP2017-503010 with English Translation Summary, 7 pages (dated May 21, 2019).

Chinese Office Action for CN201580042812.5; 8 pages (dated Jul. 5, 2019) (English-language summary included on Ids transmittal filed herewith).

English-language translation of CN-102832914-A from Google Patents.

English-language translation of CN-203326968-U from Google Patents.

English-language translation of CN-1457433-A from Google Patents.

Japanese Decision of Grant for JP 2017-503010, 3 pages (Jun. 30, 2020).

Chinese Third Office Action for 201580042812.5, 6 pages (dated Jun. 22, 2020), (the concise statement of relevance for this Chinese language document is in the accompanying transmittal).

Decision of Rejection for China Patent Application No. 201580042812.5, dated Nov. 15, 2020, (6 pages).

* cited by examiner

ONE-SHOT CIRCUIT

TECHNICAL FIELD

This specification relates generally to a one-shot circuit.

BACKGROUND

Generally, a one-short circuit includes circuitry to produce an output pulse of controlled duration in response to an input signal rising edge. One-shot circuits have traditionally been produced using an AND gate. A one-shot circuit implemented using an AND gate includes possible drawbacks. For example, if an input pulse width goes below a nominal output pulse width, the output pulse width can track the input pulse width, rather than staying constant. Also, if a downward pulse preceding the input pulse is shorter than the nominal output pulse width, the output pulse front edge can shift-out, and its width can track the downward pulse width.

SUMMARY

An example one-shot circuit may include the following elements: circuitry including a set-reset (SR) latch to produce an output pulse of controlled duration in response to an input signal rising edge, where the SR latch includes a first circuit input and a second circuit input; a circuit path to provide a signal to the first circuit input; and a delay element connected to the circuit path and to the second circuit input. The example one-shot circuit may include one or more of the following features, either alone or in combination.

The first circuit input may be a set (S) input, the second circuit input may be a reset (R) input, and the one-shot circuit may be configured to produce a positive output pulse. The first circuit input may be a reset (R) input, the second circuit input may be a set (S) input, and the one-shot circuit may be configured to produce a negative output pulse.

The delay element may be adjustable to produce an adjustable delay. The delay element may include one or more non-inverting delay buffers in series; an even number of inverters in series; a series combination of one or more non-inverting delay buffers and an even number of inverters, or a combination thereof.

The first circuit input may be a set (S) input Sn, the second circuit input may be a reset (R) input Rn, and the one-shot circuit may be configured to produce a positive output pulse (Q) Qn, where Qn is an output of the SR latch, Qn−1 is a last state of Qn, and Qb,n−1 is an inverse of the last state of Qn. The SR latch may operate according to the following truth table:

| Sn | Rn | Qn |
| --- | --- | --- |
| 1 | 0 | 1 |
| 0 | 1 | 0 |
| 0 | 0 | Qn−1 |
| 1 | 1 | Qb, n−1 |

The SR latch may include: a multiplexer comprising a first input, a second input, a select input, and a circuit output, where a value of the select input determines whether the circuit output is the first input or the second input; and a latch comprising a third input, a fourth input, and an intermediate output, where the first input and the third input are configured to receive a same first signal, the second input is configured to receive a second signal, the fourth input is configured to receive an inverted version of the second signal, and the intermediate output is connected to the select input. The third input may be the set (S) SR latch input and the fourth input may be the reset (R) SR latch input. The intermediate output may be Yn, with Yn−1 being a last state of Yn; and the latch providing the intermediate output may operate according to the following truth table:

| Sn | Rn | Yn |
| --- | --- | --- |
| 1 | 0 | 1 |
| 0 | 1 | 0 |
| 0 | 0 | Yn−1 |
| 1 | 1 | Yn−1 |

The SR latch may comprise: a latch comprising a first input, a second input, a third input, and a circuit output; and a latch comprising a fourth input, a fifth input, and an intermediate output, where the first input and the fourth input are configured to receive a same first signal, the second input and the fifth input are configured to receive a same second signal, and the intermediate output is connected to the third input. The first input may be the set (S) SR latch input and the second input may be the reset (R) SR latch input. The intermediate output may be Yn, and Yb,n may be an inverse of Yn. The latch providing the circuit output may operate according to the following truth table:

| Sn | Rn | Qn |
| --- | --- | --- |
| 1 | 0 | 1 |
| 0 | 1 | 0 |
| 0 | 0 | Qn−1 |
| 1 | 1 | Yb, n |

The latch providing the intermediate output may operate according to the following truth table:

| Sn | Rn | Yn |
| --- | --- | --- |
| 1 | 0 | 1 |
| 0 | 1 | 0 |
| 0 | 0 | Yn−1 |
| 1 | 1 | Yn−1 |

The circuitry may comprise: a first latch comprising a first input, a second input, and a first output; a second latch comprising a third input, a fourth input; and second output, the fourth input being an inverted input; and a third latch comprising a fifth input, a sixth input, a seventh input, an eighth input, and a third output. The first input, the third input, and the sixth input may be connected together to receive a first signal comprising the first circuit input; the second input, the fourth input, and the seventh input may be connected together to receive a second signal comprising the second circuit input; the first output may be connected to the fifth input; and the second output may be connected to the eighth input.

The first signal may be Sn, an immediately prior version of the first signal may be Sn−1, the second signal may be Rn, an immediately prior version of the second signal may be Rn−1, the third output may be Qn, and an immediately prior version of the third output may be Qn−1. The SR latch may operate according to the following truth table:

| Sn-1 | Rn-1 | Sn | Rn | Qn |
|---|---|---|---|---|
| 0 | 0 | 1 | 0 | 1 |
| 0 | 0 | 0 | 1 | 0 |
| 0 | 1 | 1 | 1 | 1 |
| 1 | 0 | 1 | 1 | 0 |
| 1 | 1 | 1 | 0 | Qn-1 |
| 1 | 1 | 0 | 1 | Qn-1 |
| 0 | 1 | 0 | 0 | Qn-1 |
| 1 | 0 | 0 | 0 | Qn-1 |

Example automatic test equipment (ATE) may comprise: a pattern generator for generating a test pattern to send to a device under test (DUT); a timing generator to receive the test pattern and to generate timing for a signal to send to the DUT based on the test pattern; and pin electronics to receive the signal and to send the signal to the DUT. The timing generator may comprise a one-shot circuit to produce an output pulse of controlled duration in response to an input signal rising edge. The one-shot circuit may comprise: circuitry comprising a set-reset (SR) latch, where the circuitry comprises a first circuit input and a second circuit input; a circuit path to provide a signal to the first circuit input; and a delay element connected to the circuit path and to the second circuit input.

The SR latch may comprise: a multiplexer comprising a first input, a second input, a select input, and a circuit output, where a value of the select input determines whether the circuit output is the first input or the second input; and a latch comprising a third input, a fourth input, and an intermediate output, where the first input and the third input are configured to receive a same first signal, the second input is configured to receive a second signal, the fourth input is configured to receive an inverted version of the second signals, and the intermediate output is connected to the select input. The third input may be the first circuit input and the fourth input may be the second circuit input.

The SR latch may comprise: a first latch comprising a first input, a second input, and a first output; a second latch comprising a third input, a fourth input; and second output, the fourth input being an inverted input; and a third latch comprising a fifth input, a sixth input, a seventh input, an eighth input, and a third output; where the first input, third input, and the sixth input are connected together to receive a first signal comprising the first circuit input; where the second input, the fourth input, and the seventh input are connected together to receive a second signal comprising the second circuit input; where the first output is connected to the fifth input; and where the second output is connected to the eighth input.

The SR latch may comprise: a latch comprising a first input, a second input, a third input, and a circuit output, where, in at least one case, a value of the third input determines whether the circuit output is the first input or the second input; and a latch comprising a fourth input, a fifth input, and an intermediate output, where the first input and the fourth input are configured to receive a same first signal, the second input and the fifth input are configured to receive a same second signal, and the intermediate output is connected to the third input. The fourth input may be the first circuit input and the fifth input may be the second circuit input.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described herein are examples of a one-short circuit that includes circuitry to produce an output pulse of controlled duration in response to an input signal rising edge. The example one-shot circuits described herein may be implemented using circuitry that includes a delay element and a set(S)-reset(R) latch. Generally, an SR latch is an asynchronous device that operates independently of control signals, and relies upon the states of S and R inputs to produce an output, Q.

Figure 1:
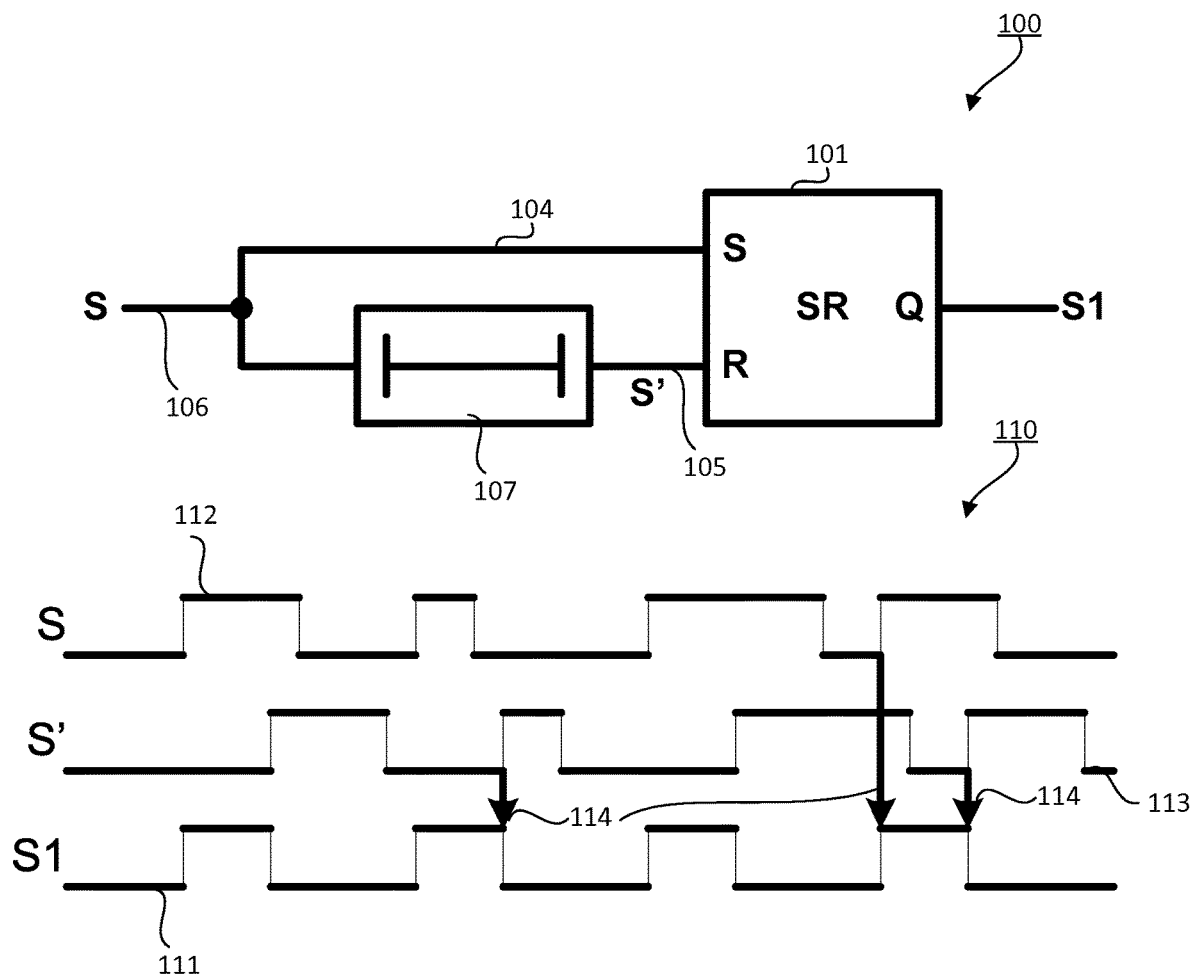
FIG. 1 is a block diagram of an example one-shot circuit and a timing diagram showing an example operation of the example one-shot circuit.

FIG. 1 shows an example of a one-shot circuit 100 that includes an SR latch that responds to S(et) and R(eset) input pulses, e.g., in this example, the output state is determined exclusively by the last incoming rising edge on either S or R. As shown in FIG. 1, one-shot circuit 100 includes circuitry comprising an SR latch 101 to produce an output pulse of controlled duration in response to an input signal rising edge. In this example, SR latch 101 includes a first circuit input (e.g., S) 104 and a second circuit input (e.g., R=S') 105. A circuit path 106 connects to the first circuit input 104 and to a delay element 107. Delay element 107 is connected to (e.g., between) circuit path 106 and second circuit input 105, as shown in FIG. 1. In the example configuration of FIG. 1, the one-shot circuit produces a positive output pulse of controlled duration in response to an input signal rising edge. In some implementations, the S and the R inputs may be switched to produce a negative output pulse of controlled duration in response to an input signal rising edge.

Figure 2:
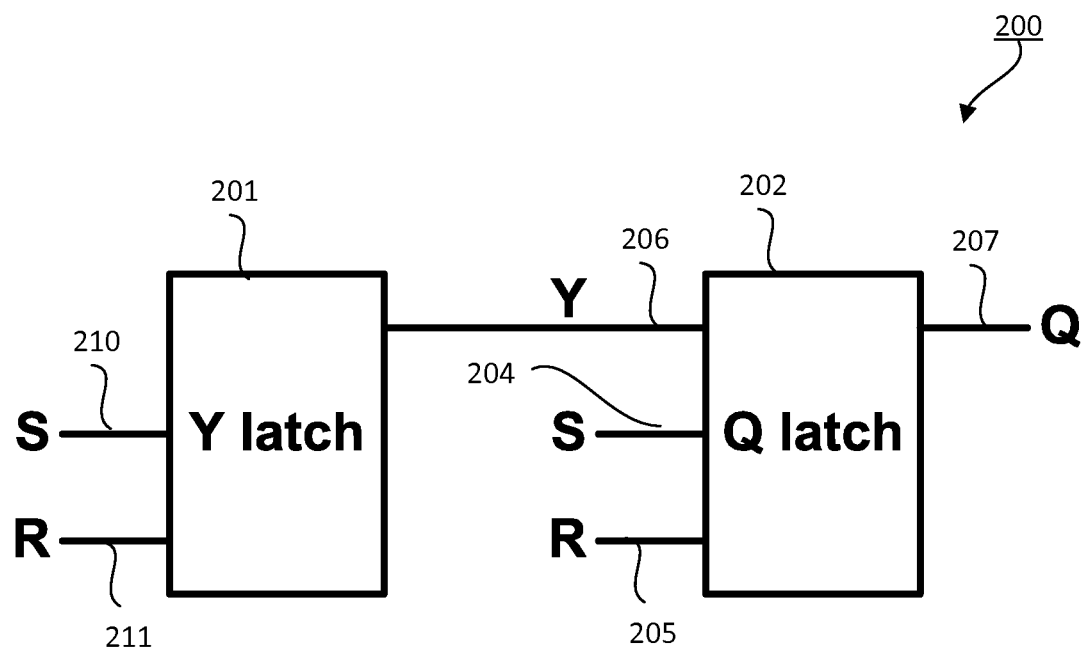
FIGS. 2 to 4 are block diagrams of example latch circuitry that may be included in the example one-shot circuit of FIG. 1.
Figure 3:
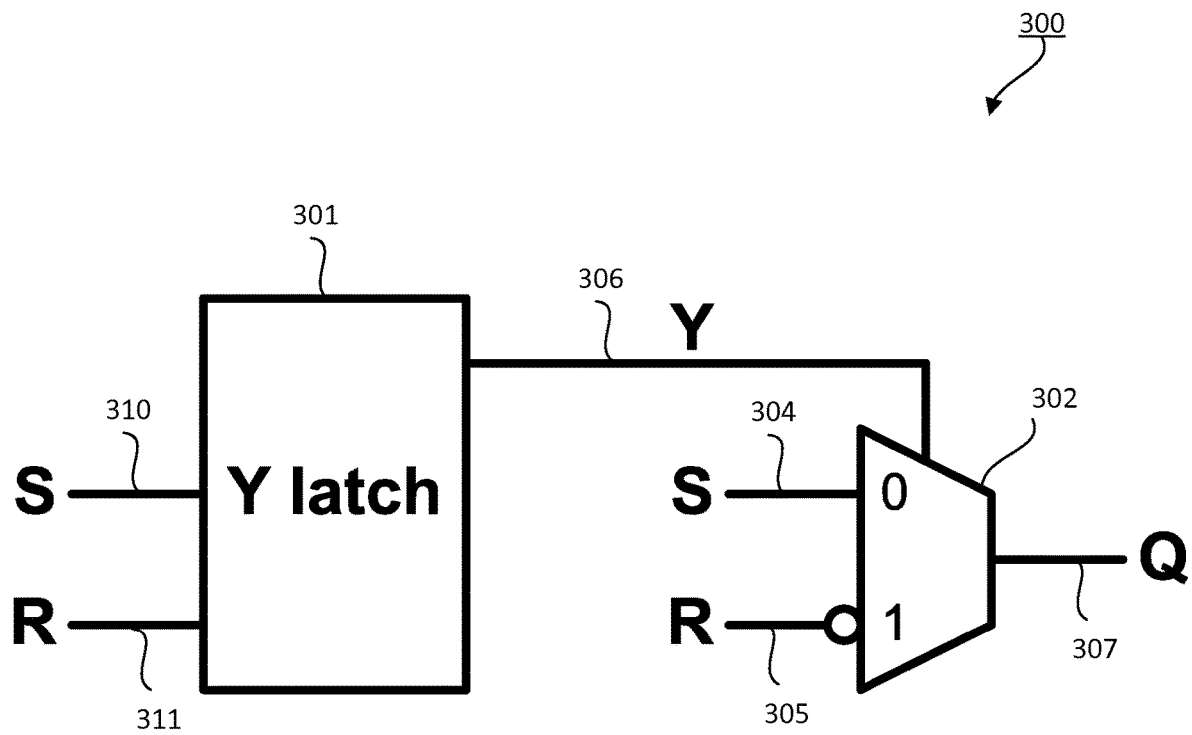
Figure 4:
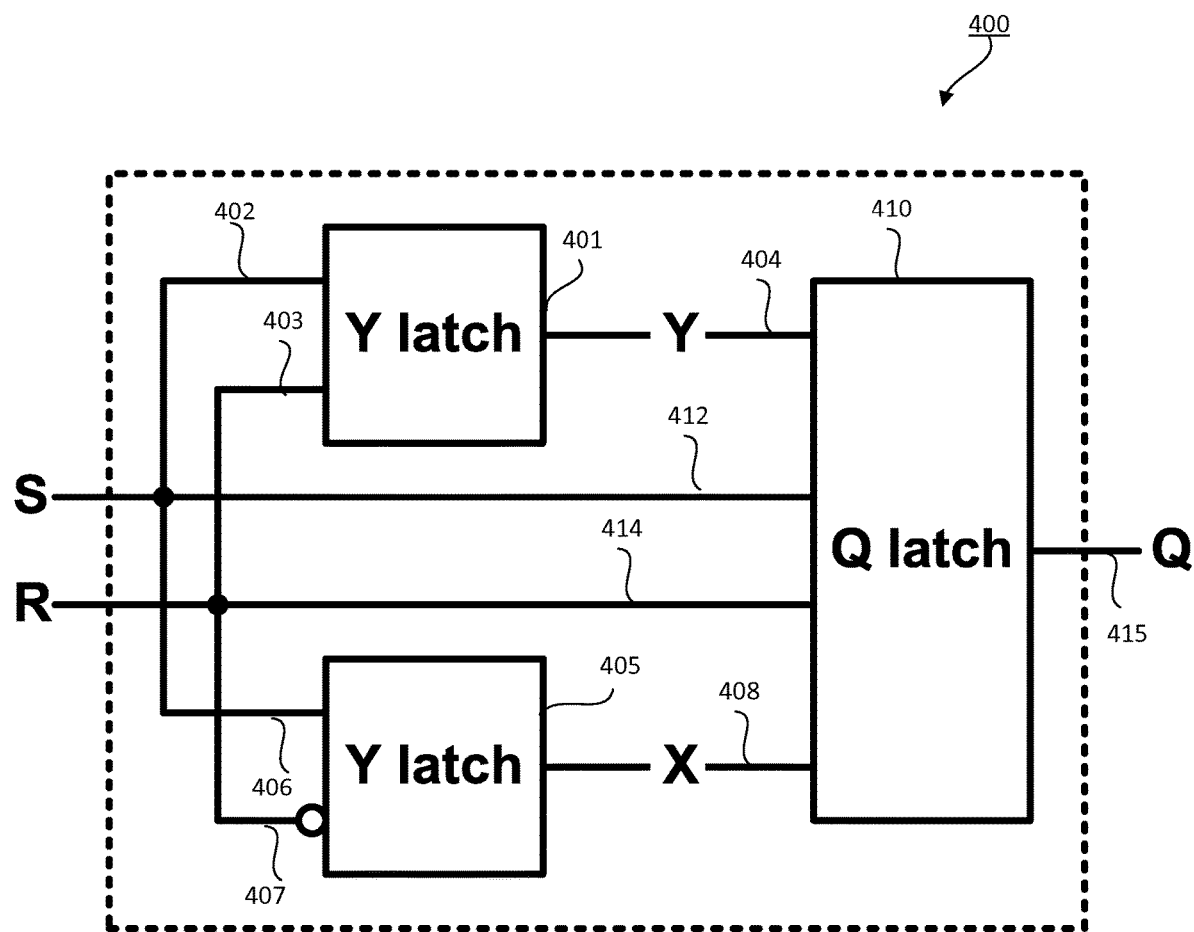

Examples of circuitry that may be used to implement SR latch 101 are shown in FIGS. 2, 3 and 4, and are described in more detail below.

In some implementations, during the operation of one-shot circuit 100, the actual S and R pulse shapes may vary and can partially overlap. And, the one-shot behavior shown in timing diagram 110 of FIG. 1 can be achieved. In this example, the nominal one-shot output pulse width is defined as "T". The time T is equal to the delay of delay element 107 for the generation of S'. In this example implementation, the S1 output (Q) waveform 111 produces a correct pulse width T and is delayed by the same amount relative to the incoming rising edge of S regardless of the widths of input pulses S 112 and S' (or R) 113. Thus, the change in S1 follows the rising edge of S' when S is high, as shown by arrows 114.

For the example one-shot circuit described here, the SR latch allows S and R to be simultaneously high, e.g., the S and R pulses may partially overlap. Rather than the output being indeterminate or assuming a default state for such an overlap condition, the output follows the last asserted input, e.g., if S comes after R, the latch sets, or if R comes after S, the latch it resets. Thus, the SR latch operates according to the following truth table, where "Qn−1" means to hold the last state and "Qb,n−1", means to hold an inverse of the last state:

| Sn | Rn | Qn |
|---|---|---|
| 1 | 0 | 1 |
| 0 | 1 | 0 |
| 0 | 0 | Qn−1 |
| 1 | 1 | Qb, n−1 |

The resultant SR latch behavior may be described as the Q output being high if the last rising input edge on either S or R was on S, while Q is low if the last rising input edge was on R, even if the S and R pulse partially overlap. It is possible to extend this typically desired behavior to cases where the S and R pulses fully overlap, e.g., the S pulse surrounds the R pulse or vice versa. In the one-shot described here, such surround conditions do not occur, so any SR latch behavior for such surround conditions is allowed. One of the example SR latches described below with a truth table with eight lines has the just mentioned behavior for surround conditions, e.g., the SR latch output always is defined by the last input rising edge on S or R, for any partial overlap and for any surround conditions.

In the example of FIG. 1, delay element 107 may be adjustable to produce an adjustable delay, which results in corresponding adjustments of the positions of the output waveforms. Delay element 107 may be implemented using any appropriate circuitry. In some implementations, delay element 107 may include: one or more non-inverting delay buffers in series, an even number of inverters in series, a series combination of one or more non-inverting delay buffers and an even number of inverters, or some other combination of circuit elements.

FIG. 2 shows an example of circuitry 200 that may be used to implement the SR latch 101. In this example, there are two latches Y latch 201 and Q latch 202. Q latch 202 includes a first input (S) 204, a second input (R) 205, a third input (Y) 206, and a circuit output (Q) 207. As shown below, in at least one case, a value of Y 206 determines whether the Q output 207 is the value of S or R. Y latch 201 includes a fourth input (S) 210, a fifth input (R) 211, and an intermediate output (Y) 206. As shown in FIG. 2, the first input 204 of Q latch 202 and the fourth input 210 of Y latch 201 are configured to receive the same signal (S); the second input 205 of Q latch 202 and the fifth input 211 of Y latch 201 are configured to receive the same second signal (R); and the intermediate output of Y latch 206 (Y) is connected to the third input 206 of Q latch 202 (and thus are the same electrical signal).

In the example of FIG. 2, the S input is Sn, the R input is Rn, the intermediate output is Yn, an inverse of the intermediate output is Yb,n, the circuit output is Qn, and the immediately previous circuit output is Qn−1. In this example, Y latch 201 operates according to the following truth table:

| Sn | Rn | Yn |
|---|---|---|
| 1 | 0 | 1 |
| 0 | 1 | 0 |
| 0 | 0 | Yn−1 |
| 1 | 1 | Yn−1 |

The Q latch operates according to the following truth table:

| Sn | Rn | Qn |
|---|---|---|
| 1 | 0 | 1 |
| 0 | 1 | 0 |
| 0 | 0 | Qn−1 |
| 1 | 1 | Yb, n |

Thus, Y latch 201 holds the circuit state for an SR input of "11", and Q latch 202 takes the Y latch output as input, and inverts it when SR is "11".

In the two above tables Yn and Qn depend in the same way on Sn and Rn, except for the last row, e.g., when Sn and Rn are both 1. The (Sn, Rn) state 11 can only be reached from (Sn−1, Rn−1) equal to 01 or 10, and for both those states we know from the two tables that Yn−1=Qn−1. Note that Yn and Qn are not equal, but Yn−1 and Qn−1 are equal if (Rn, Sn)=11. Therefore we have for the bottom right field in the last above table the following identities: Yb,n=Yb,n−1, because of the preceding table, and Yb,n−1=Qb,n−1. Together this means: Yb,n=Qb,n−1. Thus, the entire SR latch, including the Y latch and the Q latch operates according to the following truth table:

| Sn | Rn | Qn |
|---|---|---|
| 1 | 0 | 1 |
| 0 | 1 | 0 |
| 0 | 0 | Qn−1 |
| 1 | 1 | Qb, n−1 |

This table is identical to that of the desired operation of the SR latch as described earlier. Hence it furnishes a particular implementation of the desired SR latch operation. A detailed implementation of this type of SR latch is described in U.S. Pat. No. 6,291,981, which is incorporated herein by reference.

In some implementations, it may be possible to reduce, or to eliminate, the amount of memory elements in the output stage of the SR latch. This reduction in the amount of memory can increase the operational speed of the circuitry. FIG. 3 shows an example of circuitry 300 that may be used to implement SR latch 101, which uses a multiplexer ("mux") at its output stage, rather than a latch. In this example, circuitry 300 includes a Y latch 301 and a mux 302. Mux 302 includes a first input (S) 304, a second input (R) 305, a select input (Y) 306, and a circuit output (Q) 307. A value of the select input (Y) 306 determines whether the circuit output (Q) 307 is the first input (S) or the second input (R). Y latch 301 includes a third input (S) 310, a fourth input (R) 311, and an intermediate output (Y) (which is the same as the select input 306). As shown, the first input 304 of mux 302 and the third input 310 of Y-latch 301 are configured to receive a same first signal (S); the second input 305 of mux 305 is configured to receive a second signal (the inverse of R), the fourth input 311 of Y-latch 301 is configured to receive an inverted version of the second signal (R), and the intermediate output of latch 401 (Y) is connected to the select input 306 of mux 302.

In the example of FIG. 3, the S input is Sn, the R input is Rn, the intermediate output is Yn, an inverse of the intermediate output is Yb,n, the immediately previous intermediate output is Yn−1, the circuit output is Qn, and the immediately previous circuit output is Qn−1. In this example, the Y latch operates according to the following truth table:

| Sn | Rn | Yn |
|----|----|-----|
| 1  | 0  | 1   |
| 0  | 1  | 0   |
| 0  | 0  | Yn−1 |
| 1  | 1  | Yn−1 |

The mux with output Q operates according to the following truth table:

| Sn | Rn | Qn |
|----|----|-----|
| 1  | 0  | 1   |
| 0  | 1  | 0   |
| 0  | 0  | Yn  |
| 1  | 1  | Yb, n |

In the two above tables Yn and Qn depend in the same way on Sn and Rn for (Sn, Rn)=01 and 10. The (Sn, Rn) states 00 and 11 can only be reached from (Sn−1, Rn−1) equal to 01 or 10, and for both those states we know from the two tables that Yn−1=Qn−1. At the same time, the first of the above two tables says that for (Sn, Rn)=00, Yn=Yn−1. For the same input, the second of the above two tables gives Qn=Yn. Taking the last three equations together, we have for (Sn, Rn)=00, Qn=Qn−1. Similarly we may derive that for (Sn, Rn)=11, Qn=Qb,n−1. Thus, the entire SR latch, including the Y latch and the mux with Q output operates according to the following truth table:

| Sn | Rn | Qn |
|----|----|-----|
| 1  | 0  | 1   |
| 0  | 1  | 0   |
| 0  | 0  | Qn−1 |
| 1  | 1  | Qb, n−1 |

This table is once again identical to that of the desired operation of the SR latch as described earlier. Hence it furnishes another implementation of the desired SR latch operation. In this example, the circuitry includes memory in the Y-latch only.

Another example implementation of SR latch 101 includes circuitry 400 of FIG. 4. Circuitry 400 includes a first Y latch 401 having a first input (S) 402, a second input (R) 403, and a first output (Y) 404; a second Y latch 405 having a third input (S) 406, a fourth input (R) 407, and second output (X) 408, where the fourth input 407 is an inverted R input; and a third Q latch 410 having a fifth input (Y) 404, a sixth input (S) 412, a seventh input (R) 414, an eighth input (X) 408, and a third output (Q) 415. The first input 402 of the first Y latch, the third input 406 of the second Y latch, and the sixth input 412 of the Q latch are connected together to receive the set (S) signal. The second input 403 of the first Y latch, the fourth input 407 of the second Y latch, and the seventh input 414 of the Q latch are connected together to receive the reset (R) signal (the fourth input of 407 of the second Y latch receives an inverted R signal). The first output (Y) 404 of the first Y latch is connected to the fifth input (Y) of the Q latch. The second output (X) 408 of the second Y latch is connected to the eighth input (X) of the Q latch.

Circuitry 400 operates according to the following truth table, where a first signal is Sn, an immediately prior version of the first signal is Sn−1, a second signal is Rn, an immediately prior version of the second signal is Rn−1, the output of the circuitry is Qn, and an immediately prior version of the output is Qn−1:

| Sn−1 | Rn−1 | Sn | Rn | Qn |
|------|------|----|----|-----|
| 0    | 0    | 1  | 0  | 1   |
| 0    | 0    | 0  | 1  | 0   |
| 0    | 1    | 1  | 1  | 1   |
| 1    | 0    | 1  | 1  | 0   |
| 1    | 1    | 1  | 0  | Qn−1 |
| 1    | 1    | 0  | 1  | Qn−1 |
| 0    | 1    | 0  | 0  | Qn−1 |
| 1    | 0    | 0  | 0  | Qn−1 |

This table looks more complex than the four-line truth table of the two SR latch examples, but its actual behavior in the time domain may be described simply as the output Q is high or low if the last input rising edge was on S or R, respectively. Its behavior differs from the previous two example latches only for surround conditions of the S and R waveforms but this does not matter for our one-shot use case as mentioned before. Operational details of this SR latch are described in U.S. Patent Publication No. 2013/0260483, which is incorporated herein by reference.

FIGS. 2 to 4 show examples of SR latch circuitry that may be used to implement the example one-shot circuit described herein. In some implementations, different SR latch circuitry than that described herein may be used.

Modern CMOS fabrication processes can lead to device mismatch-induced unintended pulse width variation that may need correction. A one-shot circuit, such as those described herein, can provide such a correction. In this regard, the example one-shot circuitry described herein may be used in any appropriate technological context, and is not limited to use in any one field of technology. An example use for the one-shot is in automatic test equipment (ATE).

In this regard, to test components, manufacturers commonly use ATE (also referred to as "testers" or "test systems"). In an example ATE operation, in response to instructions in a test program set (TPS), ATE automatically generates input signals to be applied to a device under test (DUT), and monitors output signals from the DUT. The ATE compares the output signals with expected responses to determine whether the DUT is defective. ATE typically includes a computer system and a test instrument or a single device having corresponding functionalities. In some cases, the test instrument provides power to a DUT.

Also typically included with ATE is an interface, which may, or may not, be part of a device interface board (DIB). The interface may be configured (e.g., include one or more interfaces) to route signals between the ATE and one or more DUTs. In some implementations, the interface is configured to route signals between one or more ATE and one or more DUTs.

Figure 5:
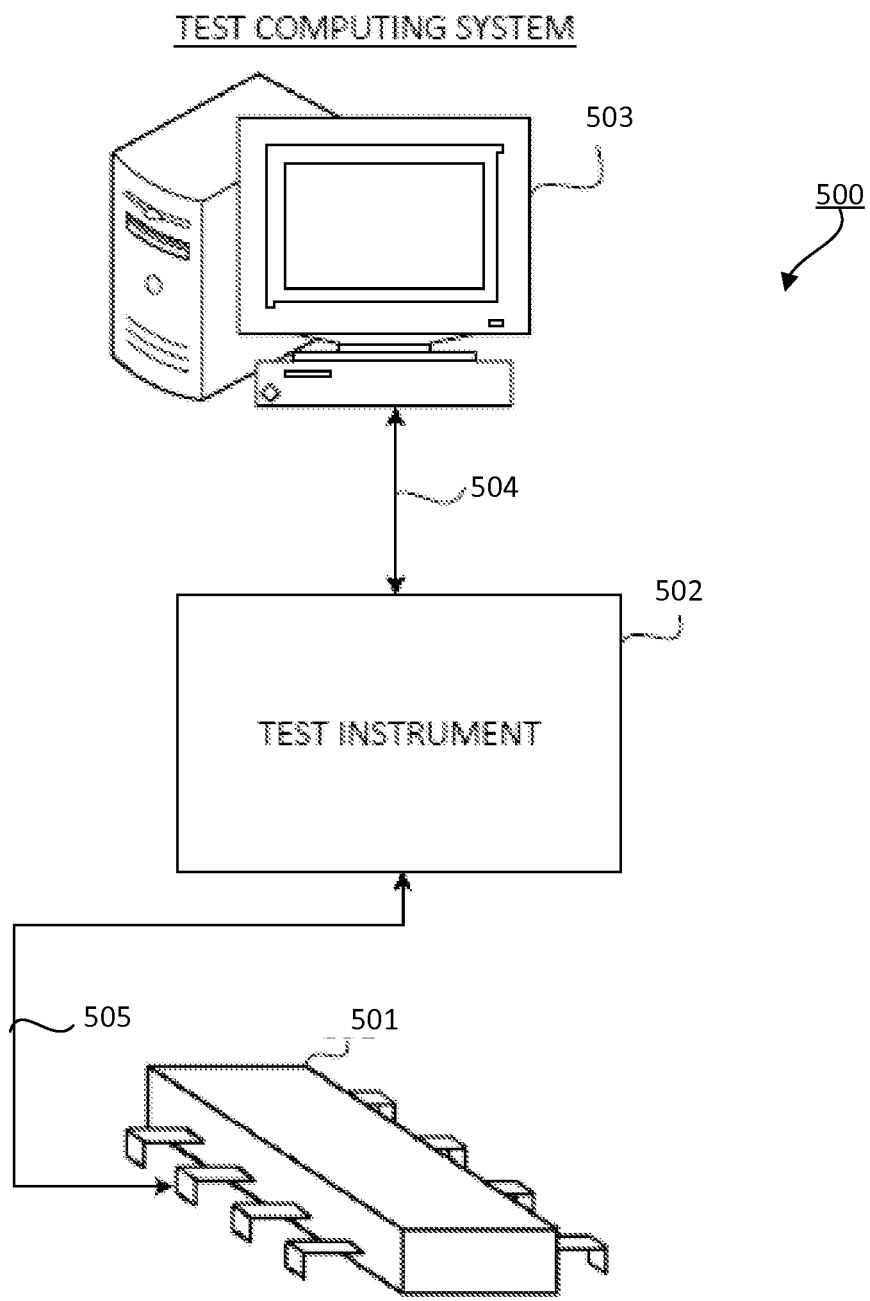
FIGS. 5 and 6 are block diagrams of example components of automatic test equipment that may employ the example one-shot circuit of FIG. 1.

Referring to FIG. 5, an ATE system 500 for testing a device-under-test (DUT) 501, such as a semiconductor device, includes a test instrument 502. To control test instrument 502, system 500 includes a test computer system 503 that interfaces with test instrument 502 over a hardwire connection 504. Typically, computer system 503 sends commands to test instrument 502 to initiate execution of routines and functions for testing DUT 501. Such executing test routines may initiate the generation and transmission of test signals to the DUT 501 and collect responses from the DUT. Various types of DUTs may be tested by system 500. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, test instrument 502 is connected to one or more connector pins that provide an interface for the internal circuitry of DUT 501. For illustrative purposes, in this example, semiconductor device test instrument 502 is connected to one connector pin of DUT 501 via a hardwire connection. A conductor 505 (e.g., cable) is connected to a pin and is used to deliver test signals (e.g., parametric measurement unit ("PMU") test signals, pin electronics ("PE") test signals, etc.) to the internal circuitry of DUT 501. Conductor 505 also senses signals in response to the test signals provided by semiconductor device test instrument 502. For example, a voltage signal or a current signal may be sensed at the pin in response to a test signal and sent over conductor 505 to test instrument 502 for analysis. Such single port tests may also be performed on other pins included in DUT 501. For example, test instrument 502 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 505 to a pin for storing a digital value on DUT 501. Once stored, DUT 501 may be accessed to retrieve and send the stored digital value over conductor 505 to test instrument 502. The retrieved digital value may then be identified to determine if the proper value was stored on DUT 501.

Along with performing one-port measurements, a two-port test may also be performed by semiconductor device test instrument 502. For example, a test signal may be injected over conductor 505 into the pin and a response signal may be collected from one or more other pins of DUT 501. This response signal is provided to semiconductor device test instrument 502 to determine quantities, such as gain response, phase response, and other throughput measurement quantities.

Figure 6:
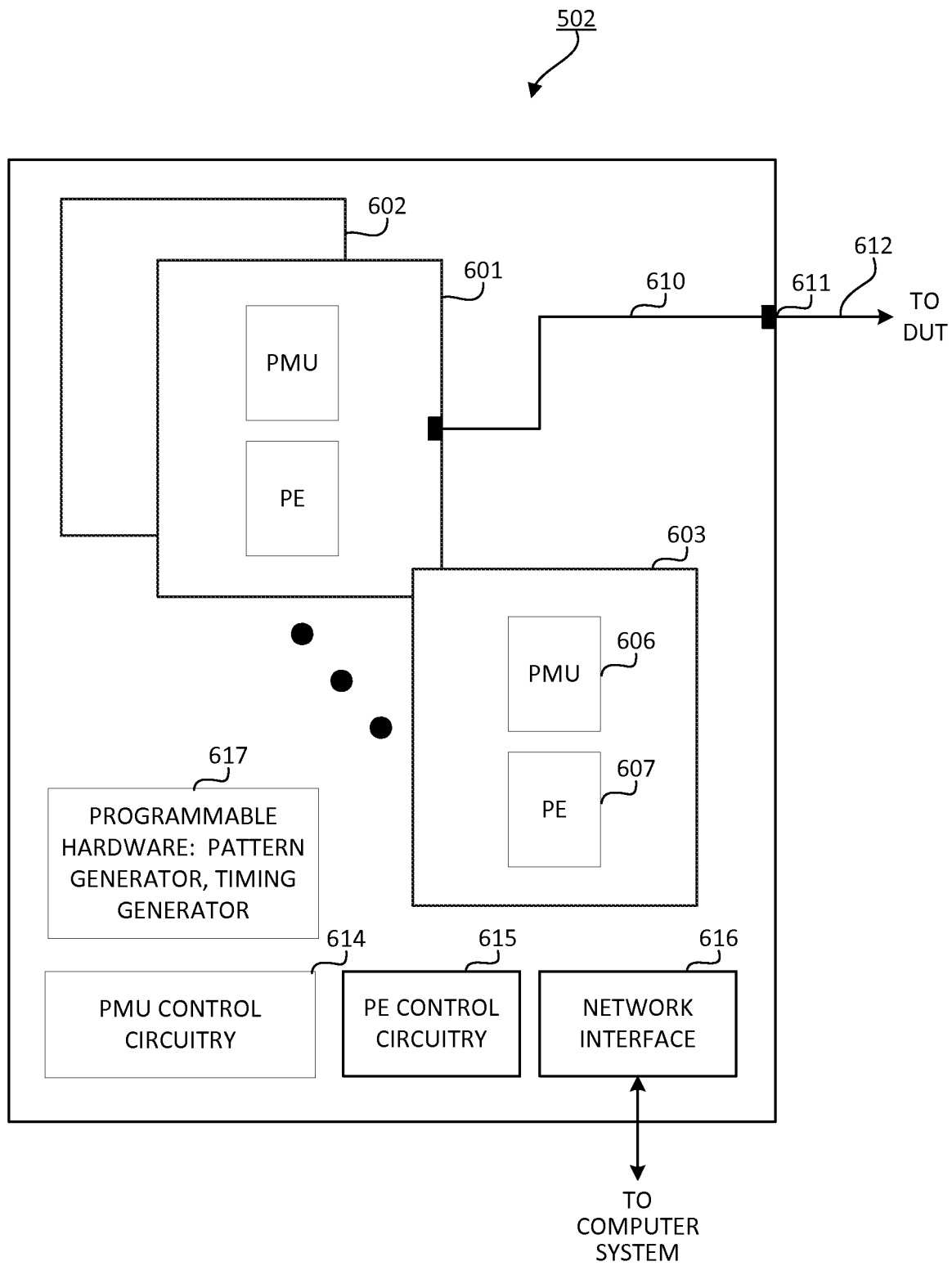

Referring also to FIG. 6, to send and collect test signals from multiple connector pins of a DUT (or multiple DUTs), semiconductor device test instrument 502 includes an interface card 601 that can communicate with numerous pins. For example, interface card 601 may transmit test signals to, e.g., 32, 64, or 128 pins and collect corresponding responses. Each communication link to a pin is referred to as a channel and, by providing test signals to a large number of channels, testing time is reduced since multiple tests may be performed simultaneously. Along with having many channels on an interface card, by including multiple interface cards in test instrument 502, the overall number of channels increases, thereby further reducing testing time. In this example, two additional interface cards 602 and 603 are shown to demonstrate that multiple interface cards may populate test instrument 502.

Each interface card includes a dedicated integrated circuit (IC) chip (e.g., an application specific integrated circuit (ASIC)) for performing particular test functions. For example, interface card 603 includes one or more IC chips for performing parametric measurement unit (PMU) tests and pin electronics (PE) tests. To perform these functions, the one or more IC chips include a PMU stage 606 that includes circuitry for performing PMU tests and a PE stage 607 that includes circuitry for performing PE tests. Additionally, interface cards 601 and 602 each include one or more IC chips that include PMU and PE circuitry.

Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 501) and collecting responses to further characterize the performance of the DUT. For example, the PE stage may transmit (to the DUT) AC test signals that represent a vector of binary values for storage on the DUT. Once these binary values have been stored, the DUT may be accessed by test instrument 502 to determine if the correct binary values have been stored. Since digital signals typically include abrupt voltage transitions, the circuitry in PE stage may operate at a high speed in comparison to the circuitry in PMU stage.

To pass both DC and AC test signals from interface card 601 to DUT 501, a conducting trace 610 connects an interface board connector 611 that allows signals to be passed on and off the interface board. Interface board connector 611 is also connected to a conductor 612, which allows signals to be passed to and from test instrument 502. In this example, conductor 612 is connected to interface connector 611 for bi-directional signal passage between test instrument 502 and a pin of the DUT.

In this example, test instrument 502 includes PMU control circuitry 614 to, among other things, coordinate operations of the various PMU stages; PE control circuitry 615 to, among other things, coordinate operations of the various PE stages; and network interface 616 to communicate with the test computer system 503 over a network or hard-wired connection. Tester 501 also includes, in this example, programmable hardware 617, such as a field-programmable gate array ("FPGA") semiconductor device, that is capable of being programmed so that the test instrument 502 responds to the DUT 501. The programmable hardware may be used to implement one or more pattern generators for generating a test pattern. A timing generator, which may also be implemented in the programmable hardware, is configured to receive the test pattern and to generate timing for a signal to send to the DUT based on the test pattern. The pin electronics receives the signal from the timing generator and to send the signal to the DUT. Rather than being implemented in programmable hardware, these circuit elements may be implemented, in whole or in part, in discrete circuit elements and/or application-specific integrated circuits (ASICs).

The timing generator may include a one-shot circuit of the type described with respect to FIGS. 1 to 4. The one-shot circuit may be configured to produce an output pulse of controlled duration in response to an input signal rising edge, as described above, to thereby provide proper timing for the test signal.

While this specification describes example implementations related to "testing" and a "test system," the one-shot circuits and associated circuitry and methods described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A one-shot circuit comprising:
   circuitry to produce output pulses, the circuitry comprising a first input to receive a first signal and a second input to receive a second signal, the circuitry being responsive to every rising edge of the first signal and the second signal to produce the output pulses so that the output pulses each have a same duration, where the circuitry comprises a multiplexer and a set-reset (SR) latch;
   a circuit path to provide the first signal to the first input; and
   a delay element connected to the circuit path to provide the second signal to the second input, the first signal and the second signal having a same logical state for at least part of a time period to produce the output pulses;
   wherein the multiplexer comprises a third input, a fourth input, a select input, and a circuit output to provide the output pulses, wherein a value of the select input determines whether the circuit output is a signal at the third input or the fourth input; and
   wherein the SR latch comprises the first input, the second, and an intermediate output, wherein the first input and the third input are configured to receive the first signal, the second input is configured to receive the second signal, the fourth input is configured to receive an inverted version of the second signal, and the intermediate output is connected to the select input.

2. The one-shot circuit of claim 1, wherein the first input is a set (S) input, the second input is a reset (R) input, and the one-shot circuit is configured to produce a positive output pulse.

3. The one-shot circuit of claim 1, wherein the first input is a reset (R) input, the second input is a set (S) input, and the one-shot circuit is configured to produce a negative output pulse.

4. The one-shot circuit of claim 1, wherein the delay element is adjustable to produce an adjustable delay.

5. The one-shot circuit of claim 1, wherein the delay element comprises one or more non-inverting delay buffers in series.

6. The one-shot circuit of claim 1, wherein the delay element comprises an even number of inverters in series.

7. The one-shot circuit of claim 1 wherein the delay element comprises a series combination of one or more non-inverting delay buffers and an even number of inverters.

8. The one-shot circuit of claim 1, wherein the first input is a set (S) input Sn, the second input is a reset (R) input Rn, and the one-shot circuit is configured to produce a positive output pulse (Q) Qn, Qn being an output of the SR latch, Qn−1 being a last state of Qn, and Qb,n−1 being an inverse of the last state of Qn; and
   wherein the SR latch operates according to the following truth table:

| Sn | Rn | Qn |
|---|---|---|
| 1 | 0 | 1 |
| 0 | 1 | 0 |
| 0 | 0 | Qn−1 |
| 1 | 1 | Qb, n−1. |

9. The one-shot circuit of claim 8, wherein the first input is a set (S) SR latch input and the second input is a reset (R) SR latch input.

10. The one-shot circuit of claim 1, wherein the intermediate output is Yn, Yn−1 being a last state of Yn; and
wherein the latch providing the intermediate output operates according to the following truth table:

| Sn | Rn | Yn |
|---|---|---|
| 1 | 0 | 1 |
| 0 | 1 | 0 |
| 0 | 0 | Yn−1 |
| 1 | 1 | Yn−1. |

11. A one-shot circuit comprising:
circuitry comprising a set-reset (SR) latch to produce output pulses, the SR latch comprising a first circuit input to receive a first signal and a second circuit input to receive a second signal, the SR latch being responsive to every rising edge of the first signal and the second signal to produce the output pulses so that the output pulses have the same duration;
a circuit path to provide the first signal to the first circuit input; and
a delay element connected to the circuit path to provide the second signal to the second circuit input, the first signal and the second signal having a same logical state for at least part of a time period to produce the output pulses;
wherein the circuitry comprises:
a first latch comprising a first input, a second input, and a first output;
a second latch comprising a third input, a fourth input; and second output, the fourth input being an inverted input; and
a third latch comprising a fifth input, a sixth input, a seventh input, an eighth input, and a third output;
wherein the first input, the third input, and the sixth input are connected together to receive the first signal;
wherein the second input, the fourth input, and the seventh input are connected together to receive the second signal;
wherein the first output is connected to the fifth input; and
wherein the second output is connected to the eighth input.

12. The one-shot circuit of claim 11, wherein the first signal is Sn, an immediately prior version of the first signal is Sn−1, the second signal is Rn, an immediately prior version of the second signal is Rn−1, the third output is Qn, and an immediately prior version of the third output is Qn−1; and
wherein the SR latch operates according to the following truth table:

| Sn−1 | Rn−1 | Sn | Rn | Qn |
|---|---|---|---|---|
| 0 | 0 | 1 | 0 | 1 |
| 0 | 0 | 0 | 1 | 0 |
| 0 | 1 | 1 | 1 | 1 |
| 1 | 0 | 1 | 1 | 0 |
| 1 | 1 | 1 | 0 | Qn−1 |
| 1 | 1 | 0 | 1 | Qn−1 |
| 0 | 1 | 0 | 0 | Qn−1 |
| 1 | 0 | 0 | 0 | Qn−1. |

13. Automatic test equipment (ATE) comprising:
a pattern generator for generating a test pattern to send to a device under test (DUT);
a timing generator to receive the test pattern and to generate timing for a signal to send to the DUT based on the test pattern; and
pin electronics to receive the signal and to send the signal to the DUT;
wherein the timing generator comprises a one-shot circuit, the one-shot circuit to produce output pulses each having a same duration, the one-shot circuit comprising:
circuitry to produce the output pulses, the circuitry comprising a first input to receive a first signal and a second input to receive a second signal, the circuitry being responsive to every rising edge of the first signal and the second signal to produce the output pulses so that the output pulses each have the same duration, where the circuitry comprises a multiplexer and a set-reset (SR) latch;
a circuit path to provide the first signal to the first input; and
a delay element connected to the circuit path to provide the second signal to the second input, the first signal and the second signal having a same logical state for at least part of a time period to produce the output pulses;
wherein the multiplexer comprises a third input, a fourth input, a select input, and a circuit output to provide the output pulses, wherein a value of the select input determines whether the circuit output is a signal at the third input or the fourth input; and
wherein the SR latch comprises the first input, the second, and an intermediate output, wherein the first input and the third input are configured to receive the first signal, the second input is configured to receive the second signal, the fourth input is configured to receive an inverted version of the second signal, and the intermediate output is connected to the select input.

14. The ATE of claim 13, wherein the delay element is adjustable to produce an adjustable delay.

15. Automatic test equipment (ATE) comprising:
a pattern generator for generating a test pattern to send to a device under test (DUT);
a timing generator to receive the test pattern and to generate timing for a signal to send to the DUT based on the test pattern; and
pin electronics to receive the signal and to send the signal to the DUT;
wherein the timing generator comprises a one-shot circuit, the one-shot circuit to produce output pulses duration, the one-shot circuit comprising:
circuitry comprising a set-reset (SR) latch, the circuitry comprising a first circuit input to receive a first signal and a second circuit input to receive a second signal, the SR latch being responsive to every rising edge of the first signal and the second signal to produce the output pulses so that the output pulses have the same duration, where the circuitry comprises a multiplexer that is controlled based on the first signal and the second signal to output the pulses;

a circuit path to provide the first signal to the first circuit input; and a delay element connected to the circuit path to provide the second signal to the second circuit input, the first signal and the second signal having a same logical state for at least part of a time period to produce the output pulses;

wherein the multiplexer comprises a first input, a second input, a select input, and a circuit output, wherein a value of the select input determines whether the circuit output is the first input or the second input;

wherein the SR latch comprises a latch comprising a third input, a fourth input, and an intermediate output, wherein the first input and the third input are configured to receive the first signal, the second input is configured to receive the second signal, the fourth input is configured to receive an inverted version of the second signal, and the intermediate output is connected to the select input; and wherein the third input is the first circuit input and the fourth input is the second circuit input.

16. Automatic test equipment (ATE) comprising:

a pattern generator for generating a test pattern to send to a device under test (DUT);

a timing generator to receive the test pattern and to generate timing for a signal to send to the DUT based on the test pattern; and pin electronics to receive the signal and to send the signal to the DUT;

wherein the timing generator comprises a one-shot circuit, the one-shot circuit to produce output pulses duration, the one-shot circuit comprising:

circuitry comprising a set-reset (SR) latch, the circuitry comprising a first circuit input to receive a first signal and a second circuit input to receive a second signal, the SR latch being responsive to every rising edge of the first signal and the second signal to produce the output pulses so that the output pulses have the same duration;

a circuit path to provide the first signal to the first circuit input; and a delay element connected to the circuit path to provide the second signal to the second circuit input, the first signal and the second signal having a same logical state for at least part of a time period to produce the output pulses;

wherein the SR latch comprises:

a first latch comprising a first input, a second input, and a first output;

a second latch comprising a third input, a fourth input; and second output, the fourth input being an inverted input; and a third latch comprising a fifth input, a sixth input, a seventh input, an eighth input, and a third output;

wherein the first input, third input, and the sixth input are connected together to receive the first signal;

wherein the second input, the fourth input, and the seventh input are connected together to receive the second signal;

wherein the first output is connected to the fifth input; and wherein the second output is connected to the eighth input.

* * * * *